(12) United States Patent
Tong et al.

(10) Patent No.: US 9,679,784 B2
(45) Date of Patent: Jun. 13, 2017

(54) WAFER-LEVEL PACKAGED OPTICAL SUBASSEMBLY AND TRANSCEIVER MODULE HAVING SAME

(71) Applicant: SAE Magnetics (H.K.) Ltd., Hong Kong (HK)

(72) Inventors: Dennis Tak Kit Tong, Hong Kong (HK); Vincent Wai Hung, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 295 days.

(21) Appl. No.: 14/702,785

(22) Filed: May 4, 2015

(65) Prior Publication Data

US 2015/0235870 A1    Aug. 20, 2015

Related U.S. Application Data

(62) Division of application No. 13/934,186, filed on Jul. 2, 2013, now Pat. No. 9,052,476.

(60) Provisional application No. 61/668,018, filed on Jul. 4, 2012.

(51) Int. Cl.
  *G02B 6/12*    (2006.01)
  *H01L 21/56*   (2006.01)
  *H01L 21/78*   (2006.01)

(52) U.S. Cl.
  CPC ........ *H01L 21/561* (2013.01); *G02B 6/12002* (2013.01); *H01L 21/78* (2013.01)

(58) Field of Classification Search
  CPC ... G02B 6/4204; G02B 6/12002; G02B 6/423
  See application file for complete search history.

(56) References Cited

U.S. PATENT DOCUMENTS

| 2005/0161805 A1* | 7/2005 | Ono ................. H01L 27/14618 257/704 |
| 2006/0159403 A1* | 7/2006 | Cheng ................. G02B 6/4201 385/86 |
| 2008/0032142 A1* | 2/2008 | Tasumi ................. H01L 33/507 428/447 |
| 2012/0128292 A1* | 5/2012 | Hamamura ........... G02B 6/4201 385/14 |

FOREIGN PATENT DOCUMENTS

CN  1645598 A  7/2005

OTHER PUBLICATIONS

1st Office Action of counterpart Chinese Patent Application No. 201310279969.2 issued on Oct. 28, 2016.

* cited by examiner

*Primary Examiner* — Charlie Y Peng

(57) ABSTRACT

A wafer-level packaged optical subassembly includes: a substrate element, the substrate element including a top layer and a base layer being bonded with the top layer; a top window cover being bonded with the top layer of the substrate element; and a plurality of active optoelectronic elements disposed within the substrate element. At least one primary cavity is defined in the substrate element by the top layer and the base layer, and configured for accommodating the active optoelectronic elements. A plurality of peripheral cavities are defined around the at least one primary cavity as alignment features for external opto-mechanical parts.

17 Claims, 8 Drawing Sheets

WAFER-LEVEL PACKAGED OPTICAL SUBASSEMBLY AND TRANSCEIVER MODULE HAVING SAME

CROSS-REFERENCE TO RELATED APPLICATIONS

This application is a Divisional Application of U.S. patent application Ser. No. 13/934,186 filed on Jul. 2, 2013, which claims the benefit of U.S. Provisional Patent Application No. 61/668,018 filed on Jul. 4, 2012, the contents of which is hereby incorporated by reference.

FIELD OF THE PATENT APPLICATION

The present patent application generally relates to optoelectronics technologies and more specifically to a wafer-level packaged optical subassembly, a method for fabricating the optical subassembly, and a transceiver module having the optical subassembly.

BACKGROUND

Packaging of optoelectronic components for an optical transceiver module largely follow two approaches conventionally. One approach makes use of a metal-can package with a transparent window to hermetically seal active optoelectronic elements. This system suffers from the following drawbacks: the costly metal-can package, packaging process only deals with one module at a time, a slow laser welding process is required for hermetic sealing, and a slow manual active alignment process is required to fix the external lens cap for optimal coupling. Another approach directly bonds active optical components and driver ICs onto a printed circuit board (PCB). It, however, suffers from the following drawbacks: specialty high-precision lens bonding equipment is required to bond a polymer lens onto the PCB; the polymer lens component does not provide hermetic sealing; the packaging process only handles one module at a time; and the burn-in process to screen out weak laser components can only be carried out at the module level.

SUMMARY

The present patent application is directed to a wafer-level packaged optical subassembly. In one aspect, the wafer-level packaged optical subassembly includes: a substrate element, the substrate element including a top layer and a base layer being bonded with the top layer; a top window cover being bonded with the top layer of the substrate element; and a plurality of active optoelectronic elements disposed within the substrate element. At least one primary cavity is defined in the substrate element by the top layer and the base layer, and configured for accommodating the active optoelectronic elements. A plurality of peripheral cavities are defined around the at least one primary cavity as alignment features for external opto-mechanical parts.

The active optoelectronic elements may include laser diodes or photo detectors, in either a singlet form or an array form. The wafer-level packaged optical subassembly may further include a plurality of upper conductive pads. The upper conductive pads may be disposed on a bottom surface of the primary cavity, and configured for bonding to the active optoelectronic elements. The wafer-level packaged optical subassembly may further include a plurality of lower conductive pads. The lower conductive pads may be disposed at a lower peripheral surface of the optical subassembly. Vias may be defined within the base layer, filled with metal and connected with the lower conductive pads respectively. The lower conductive pads may be attached with solder balls configured to allow the optical subassembly to be attached to a circuit board.

A plurality of optical elements may be defined on the top window cover. The optical elements may be aligned with the active optoelectronic elements and configured to facilitate the coupling of optical signals between the active optoelectronic elements and external fibers.

A plurality of openings may be defined on the top window cover, and each of the openings may be aligned with one of the peripheral cavities. The size of each opening may be larger than that of the peripheral cavity aligned with the opening.

The projection of the primary cavity on the top window cover may have a squared shape, and the projections of the peripheral cavities on the top window cover may have a circular shape.

The projection of the primary cavity on the top window cover may have a squared shape, while the projections of the peripheral cavities on the top window cover may have a squared shape. Side walls of the primary cavity and the peripheral cavities may not be perpendicular to a surface plane of the top window cover.

The wafer-level packaged optical subassembly may further include an interface IC and a plurality of solder bumps. The interface IC may be flip-chip bonded to a back side of the base layer, while the solder bumps may be deposited at the back side of the base layer and electrically connected with the interface IC.

In another aspect, the present patent application provides a method for fabricating an optical subassembly. The method includes: fabricating a top layer silicon wafer, the top layer silicon wafer including a plurality of individual units of a top layer; fabricating a base layer silicon wafer, the base layer silicon wafer including a plurality of individual units of a base layer; aligning and bonding the top layer silicon wafer and the base layer silicon wafer thereby forming a first wafer assembly; assembling a plurality of active optoelectronic elements onto the first wafer assembly; fabricating a glass wafer; aligning and bonding the glass wafer to the first wafer assembly thereby forming a second wafer assembly; and dicing the second wafer assembly into individual optical subassemblies. The step of fabricating the top layer silicon wafer includes etching a primary cavity and a plurality of peripheral cavities of each individual unit of the top layer. The active optoelectronic elements are assembled within the primary cavities of the first wafer assembly.

The step of fabricating the top layer silicon wafer may further include wafer thinning, and deposition of an oxide layer for wafer bonding. The step of fabricating of the base layer silicon wafer may include wafer thinning, etching of through via holes, deposition of an oxide layer for insulation, deposition of metal to fill the via holes, deposition of metal patterns on top and bottom surfaces of the base layer silicon wafer, and surface finishing to enable component bonding. The method may further include attaching solder bumps to a back side of the second wafer assembly.

In yet another aspect, the present patent application provides a transceiver module that includes: at least a circuit substrate; at least one optoelectronic interface IC; an optical subassembly, the optical assembly including: a substrate element, the substrate element including a top layer and a base layer being bonded with the top layer; a top window cover being bonded with the top layer of the substrate element; and a plurality of active optoelectronic elements disposed within the substrate element; and a fiber jumper plug configured to interface the optical subassembly with optical fibers for optical signal transmission. At least one primary cavity is defined in the substrate element by the top layer and the base layer, and configured for accommodating the active optoelectronic elements. A plurality of peripheral cavities are defined around the at least one primary cavity as alignment features for external opto-mechanical parts. The optical subassembly and the interface IC are mounted on the circuit substrate. The optoelectronic interface IC is electrically connected to the optical subassembly module through high-speed conductive traces.

The fiber jumper plug may include an alignment block and a fiber array. The alignment block may include a fiber mounting portion and a subassembly mounting portion, and the fiber array may be fixed onto the alignment block using adhesive. The fiber mounting portion may be in-line with an engagement direction of the optical subassembly.

The subassembly mounting portion may include an angled facet. The angled facet is configured to direct light beams originated from the active optoelectronic elements towards the fiber array.

BRIEF DESCRIPTIONS OF THE DRAWINGS

DETAILED DESCRIPTION

Reference will now be made in detail to a preferred embodiment of the wafer-level packaged optical subassembly and the transceiver module having the same disclosed in the present patent application, examples of which are also provided in the following description. Exemplary embodiments of the wafer-level packaged optical subassembly and the transceiver module having the same disclosed in the present patent application are described in detail, although it will be apparent to those skilled in the relevant art that some features that are not particularly important to an understanding of the wafer-level packaged optical subassembly and the transceiver module having the same may not be shown for the sake of clarity.

Furthermore, it should be understood that the wafer-level packaged optical subassembly and the transceiver module having the same disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
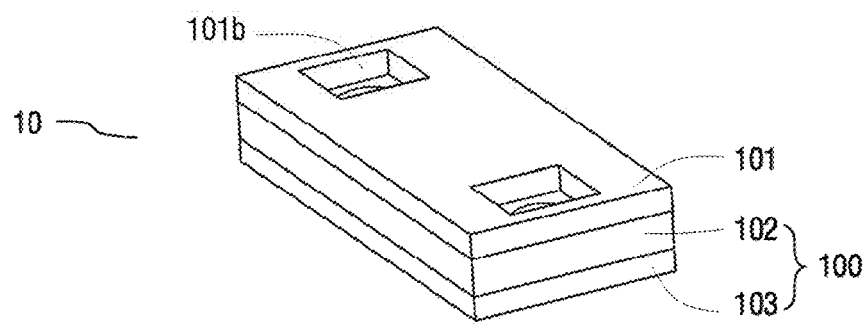
FIG. 1 is a perspective view of a fully-assembled optical subassembly in accordance with an embodiment of the present patent application.
Figure 2:
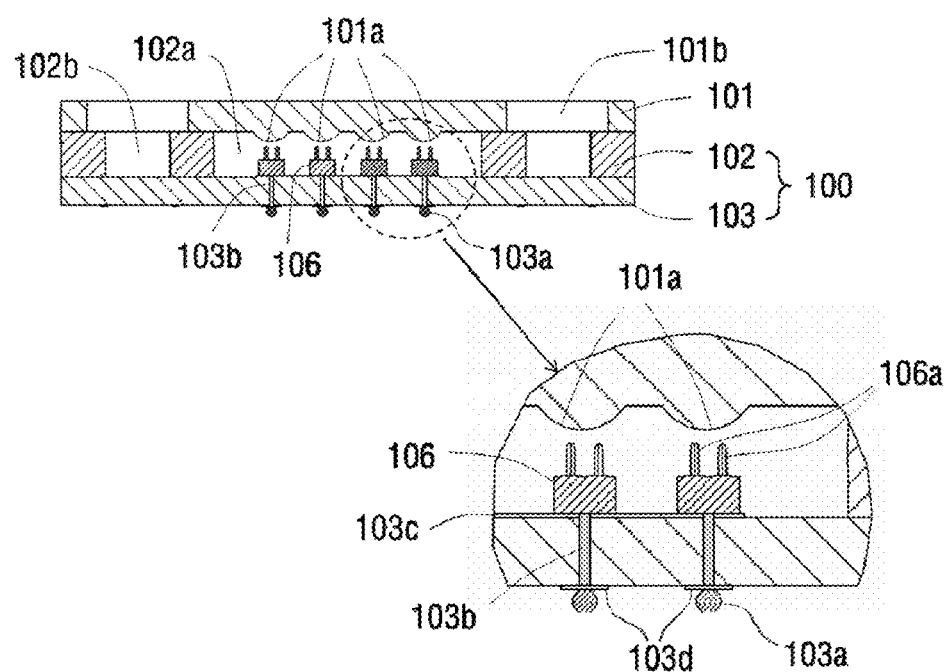
FIG. 2 shows a cross-section view and a partial magnified view of the fully-assembled optical subassembly depicted in FIG. 1.

FIG. 1 is a perspective view of a fully-assembled wafer-level packaged optical subassembly in accordance with an embodiment of the present patent application. FIG. 2 shows a cross-section view and a partial magnified view of the fully-assembled optical subassembly depicted in FIG. 1. Referring to FIG. 1 and FIG. 2, the optical subassembly 10 includes a top window cover 101, a substrate element 100 and a plurality of active optoelectronic elements 106. The active optoelectronic elements 106 may include laser diodes or photo detectors, in either a singlet form or an array form. The substrate element 100 is fabricated using a silicon-based wafer material. In this embodiment, the substrate element 100 further includes a top layer 102 and a base layer 103. These two portions are stacked and bonded together using hermetic wafer bonding processes to form the substrate element 100. The substrate element 100 has at least one primary cavity 102a, which is defined by the top layer 102 and the base layer 103, and configured for accommodating the active optoelectronic elements 106. A number of peripheral cavities 102b are defined and located around the primary cavity 102a as alignment features for external opto-mechanical parts. The primary cavity 102a and the peripheral cavities 102b are both realized using photolithography and silicon micro-electromechanical systems (MEMS) etching processes and thus the relative positions and dimensions of these features can be maintained with a high accuracy. A number of upper conductive pads 103c are disposed on the bottom surface of the primary cavity 102a, and configured for bonding to the active optoelectronic elements 106. When assembling the active optoelectronic elements 106, the relative positions between the said components and that of cavities 102b are precisely controlled.

Electrical connections from the active optoelectronic elements 106 are brought to lower conductive pads 103d at a lower peripheral surface of the optical subassembly 10 through conductive vias 103b, defined and fabricated within the base layer 103 of the substrate element 100. The vias 103b are designed to allow high-speed analog electrical signals to pass through without excess attenuation. Solder balls 103a are attached to the lower conductive pads 103d to allow the optical subassembly 10 to be attached to application circuit boards using standard surface mount component attachment processes.

Figure 3:
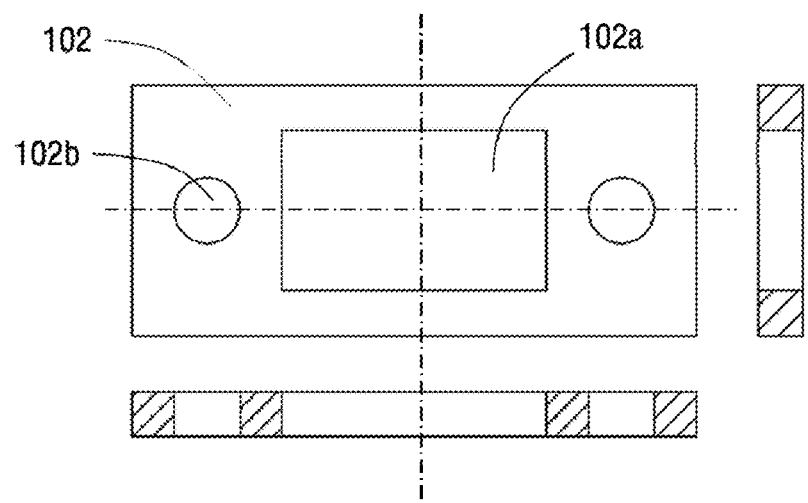
FIG. 3 shows top and cross-sectional side views of a top portion of a substrate element of the optical subassembly depicted in FIG. 1.
Figure 6:
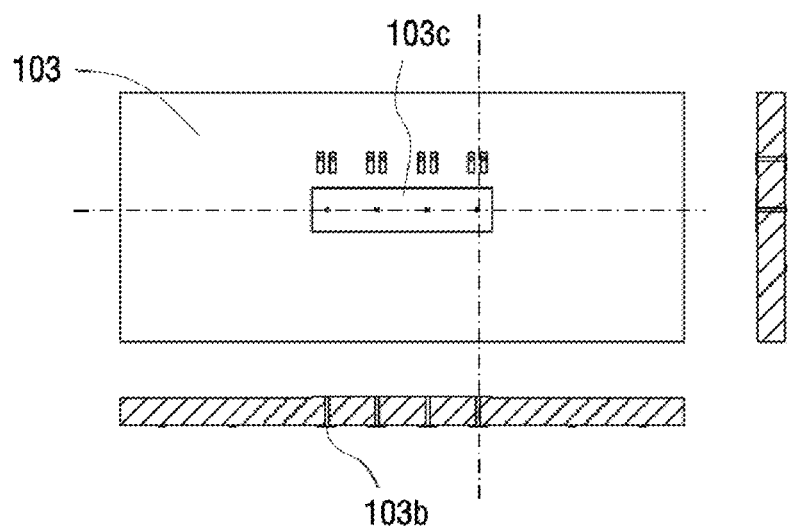
FIG. 6 shows top and cross-section side views of a bottom portion of the substrate element of the optical subassembly depicted in FIG. 1.

FIG. 3 shows top and cross-sectional side views of a top portion of a substrate element of the optical subassembly depicted in FIG. 1. Referring to FIGS. 1-3, the top part of the optical subassembly 10 is the light-transmitting top window cover 101, which allows optical signals to pass through. The top window cover 101 can be fabricated using a glass wafer and directly bonded to the top surface of the silicon substrate element 100 using hermetic bonding processes such as anodic bonding. The top window cover 101 seals the primary cavity 102a and the optoelectronic components 106 within the primary cavity 102a. Some optical elements 101a may be defined on the top window cover 101. These optical elements 101a are aligned with the active optoelectronic elements 106 and configured to facilitate the coupling of optical signals between the active optoelectronic elements 106 and external fibers. The top window cover further has openings 101b defined thereon, each of which is aligned with a peripheral cavity 102b. The size of each opening 101b is larger than that of the peripheral cavity 102b aligned with the opening 101b. FIG. 6 shows top and cross-section side views of a bottom portion of the substrate element of the optical subassembly depicted in FIG. 1. It is noted that as shown in FIG. 3, the projection of the primary cavity 102a on the top window cover 106 has a squared shape, and the projections of the peripheral cavities 102b on the top window cover 106 have a circular shape.

Figure 4:
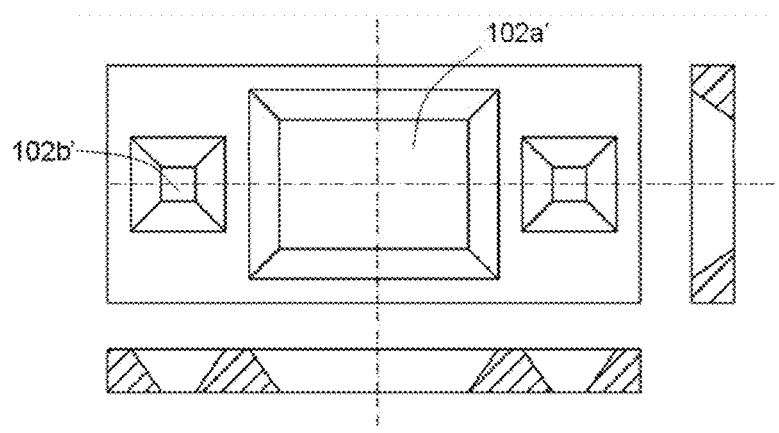
FIG. 4 shows top and cross-sectional side views of a top portion of a substrate element of an optical subassembly in accordance with another embodiment of the present patent application.

FIG. 4 shows top and cross-sectional side views of a top portion of a substrate element of an optical subassembly in accordance with another embodiment of the present patent application. Referring to FIG. 4, the projection of the primary cavity 102a' on the top window cover has a squared shape, while the projections of the peripheral cavities 102b' on the top window cover have a squared shape. In addition, side walls of the primary cavity 102a' and the peripheral cavities 102b' are not perpendicular to the surface plane of the top window cover.

Figure 5:
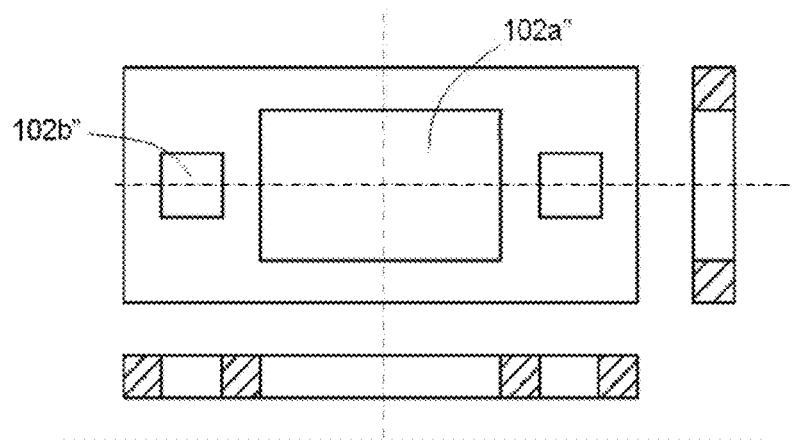
FIG. 5 shows top and cross-sectional side views of a top portion of a substrate element of an optical subassembly in accordance with yet another embodiment of the present patent application.

FIG. 5 shows top and cross-sectional side views of a top portion of a substrate element of an optical subassembly in accordance with yet another embodiment of the present patent application. Referring to FIG. 5, the projection of the primary cavity 102a" on the top window cover has a squared shape, while the projections of the peripheral cavities 102b" on the top window cover have a squared shape. In addition, side walls of the primary cavity 102a" and the peripheral cavities 102b" are perpendicular to the surface plane of the top window cover.

Figure 7:
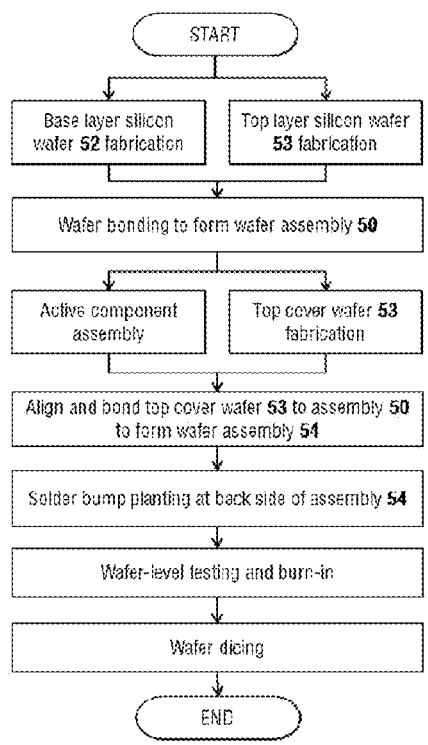
FIG. 7 is a flow chart illustrating a method for fabricating an optical subassembly in accordance with still another embodiment of the present patent application.
Figure 8:
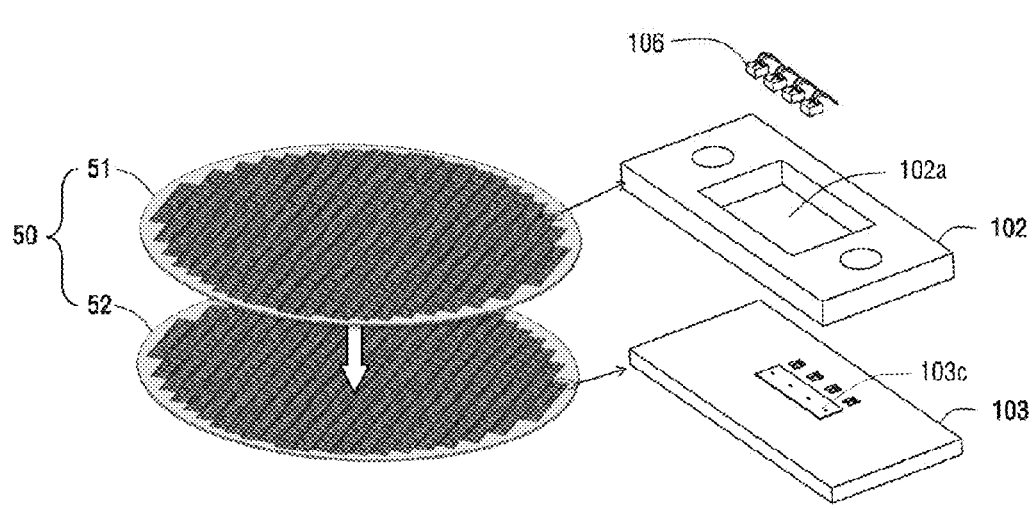
FIG. 8 illustrates a silicon wafer fabrication and assembly process in the method depicted in FIG. 7.

FIG. 7 is a flow chart illustrating a method for fabricating an optical subassembly in accordance with still another embodiment of the present patent application. In this embodiment, the optical subassembly to be fabricated is the optical subassembly 10 depicted in FIG. 1. The process starts with the fabrication of a top layer silicon wafer 51 and a base layer silicon wafer 52. These two wafers contain individual units of the top layer 102 and the base layer 103 of the optical subassembly 10 respectively. The fabrication of the top layer silicon wafer 51 involves the following steps: wafer thinning, deposition of an oxide layer for wafer bonding, and etching the primary cavity 102a and the peripheral cavities 102b of each individual unit of the top layer. The fabrication of the base layer silicon wafer 52 involves the following steps: wafer thinning, etching of through via holes, deposition of an oxide layer for insulation, deposition of metal to fill the via holes, deposition of metal patterns on top and bottom surfaces of the base layer silicon wafer, and surface finishing to enable component bonding. The completed wafers are then aligned and bonded together to form wafer assembly 50, which contains individual wafer unit of the substrate element 100, as illustrated in FIG. 8. The two wafers are aligned in a way that conductive pads 103c are located within the confinement of the primary cavity 102a. Active optical components (i.e. active optoelectronic elements) 106 are assembled onto the conductive pads 103c within the primary cavities 102a of the wafer assembly 50. The assembly process may involve precision die attach, wire bonding or flip-chip bonding, and etc.

Figure 9:
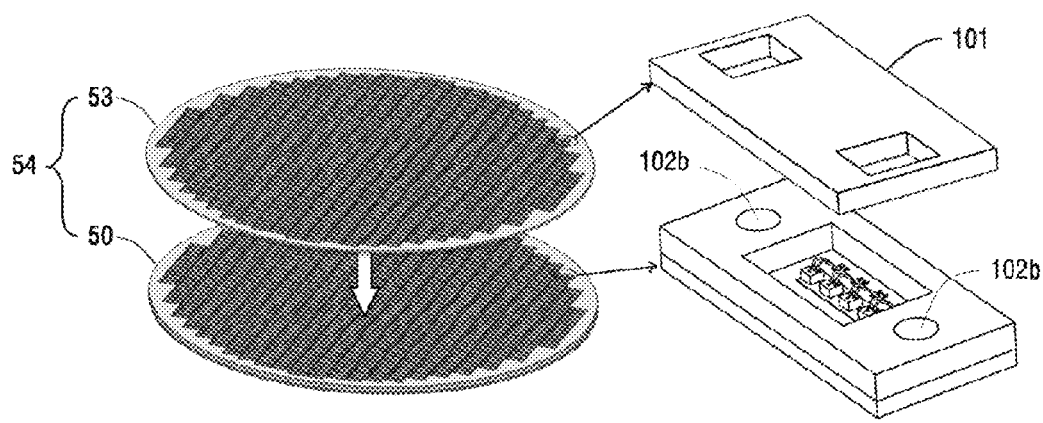
FIG. 9 illustrates a glass wafer fabrication and assembly process in the method depicted in FIG. 7.

Referring to FIG. 9, a top cover wafer 53, which is a light-transmitting glass wafer, is fabricated. The fabrication process to produce this wafer involves formation of the optical elements 101a, the openings 101b and any alignment marks that facilitate later wafer bonding process. The top cover wafer 53 is then aligned and bonded on top of the wafer assembly 50, which contains active components, to form a final wafer assembly 54. Solder bumps are subsequently attached to the metal pads (part of the metal patterns) at the back side of this assembly. Before the final step of wafer dicing, in which the final wafer assembly is diced into individual optical subassemblies, the final wafer assembly 54 is put through wafer level testing (light source optical power and slope efficiency, photo detector dark current and capacitance, etc.) and burn-in to screen out faulty and weak units.

Figure 10:
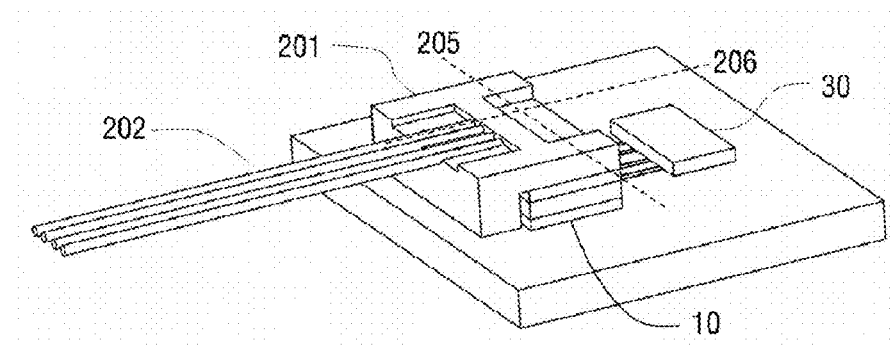
FIG. 10 is a perspective view of a transceiver module using an optical subassembly in accordance with still another embodiment of the present patent application.
Figure 11:
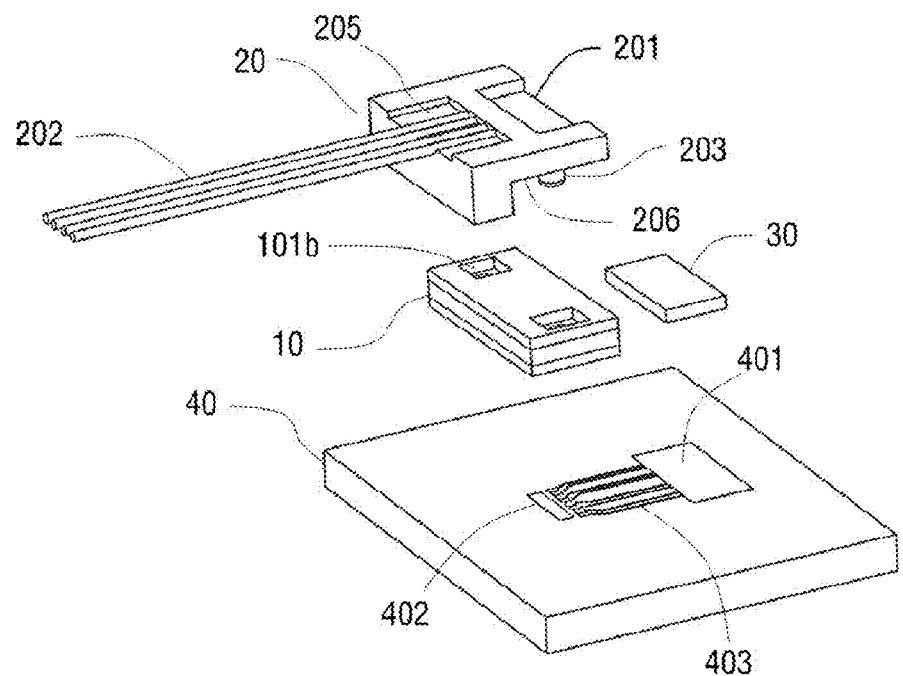
FIG. 11 is an exploded view of the transceiver module depicted in FIG. 10.

FIG. 10 is a perspective view of a transceiver module using an optical subassembly in accordance with still another embodiment of the present patent application. FIG. 11 is an exploded view of the transceiver module depicted in FIG. 10. In this embodiment, the optical subassembly is the optical subassembly 10 depicted in FIG. 1. Referring to FIG. 10 and FIG. 11, in addition to the optical subassembly 10, the transceiver module further includes at least a circuit substrate 40, at least one optoelectronic interface IC 30 and a fiber jumper plug 20. The optical subassembly 10 and the interface IC 30 are mounted on the circuit substrate 40 at their respective bonding pads 402 and 401. The optoelectronic interface IC 30 is electrically connected to the optical subassembly module 10 through high-speed conductive traces 403. The circuit substrate 40 also provides a high-speed electronic interface (not shown) to interface with an external system. Through the interface IC 30, an electrical signal from the external system is converted to an analog driving signal and transmitted to the laser sources within the optical subassembly 10 which turns the electrical signal to an optical signal for further transmission over the fiber. On the other hand, an optical signal received by the photo detectors are converted to an analog electrical signal and transmitted back to the interface IC 30 via the electrical connection path. The interface IC 30 further converts the analog signal into a high-speed digital signal to be provided to the external system.

Figure 12:
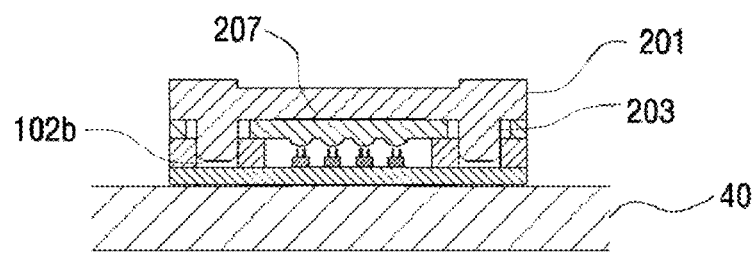
FIG. 12 is a cross-sectional view of the transceiver module depicted in FIG. 10 along the fiber mounting portion.
Figure 13:
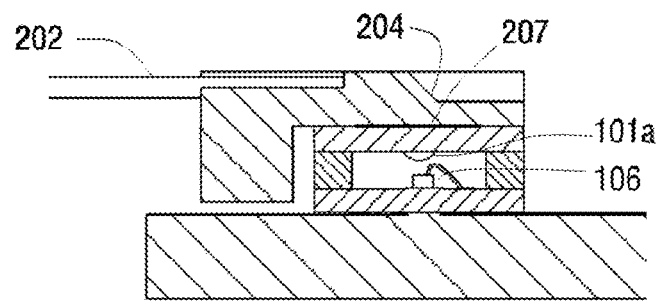
FIG. 13 is a cross-sectional view of transceiver module depicted in FIG. 10 along the subassembly mounting portion.

Referring to FIG. 10 and FIG. 11, on top of the optical subassembly 10, the fiber jumper plug 20 is configured to interface the optical subassembly 10 with optical fibers for optical signal transmission. The fiber jumper plug 20 includes an alignment block 201 and a fiber array 202. The alignment block 201 is a high-precision part fabricated using light transmitting material such as polymer or glass. It includes a fiber mounting portion 205 and a subassembly mounting portion 206. The fiber mounting portion 205 includes precise positioning structures to locate and stop individual fibers in the fiber array 202. Once located, the fiber array 202 is fixed onto the alignment block 201 using adhesive or equivalent means. The subassembly mounting portion 206 is located at an angle with respect to the fiber mounting portion 205. FIG. 12 is a cross-sectional view of the transceiver module depicted in FIG. 10 along the fiber mounting portion 205. Referring to FIG. 11 and FIG. 12, the subassembly mounting portion 206 includes precision alignment pins 203 and a light transmission region 207. The light transmission region 207 has an optical-grade surface to facilitate optical beam transmission with minimal loss. FIG. 13 is a cross-sectional view of transceiver module depicted in FIG. 10 along the subassembly mounting portion 206. Referring to FIG. 13, above the light transmission region 207, there is an angled facet 204 (included in the subassembly mounting portion 206) being configured for directing incoming light beams from the transmission region 207 (originated from the active optoelectronic elements 106) towards the fiber array 202 and vice versa. The fiber jumper plug 20 engages with the optical subassembly 10 by inserting the alignment pins 203 through the openings 101b into the cavities 102b. The precise dimensional control of the alignment pins 203 allows them to fit into the cavities 102b without excess gap for movements.

The cavity 102b in FIG. 3, the cavity 102b' in FIG. 4 and the cavity 102b" in FIG. 5 are in different shapes. When fully engaged, each of the fiber fixed at the fiber mounting portion 205 is optically aligned with the active optoelectronic elements 106 within the optical subassembly 10. Optical signals generated by the laser sources within the optical subassembly 10 enter the alignment block 201 through the light transmission region 207. Light is reflected by the reflecting surface (i.e. the angled facet) 204 and directed towards the fiber at the fiber mounting portion 205. The optical element 101a is configured for focusing the light at the fiber entrance to optimize coupling efficiency. Additional optics may be present on the light transmission region 207 and reflecting surface 204 to further optimize light coupling into the fiber. Light emitted by the optical fiber follows an opposite path and gets focused down to the photo detectors within the optical subassembly 10.

Figure 14:
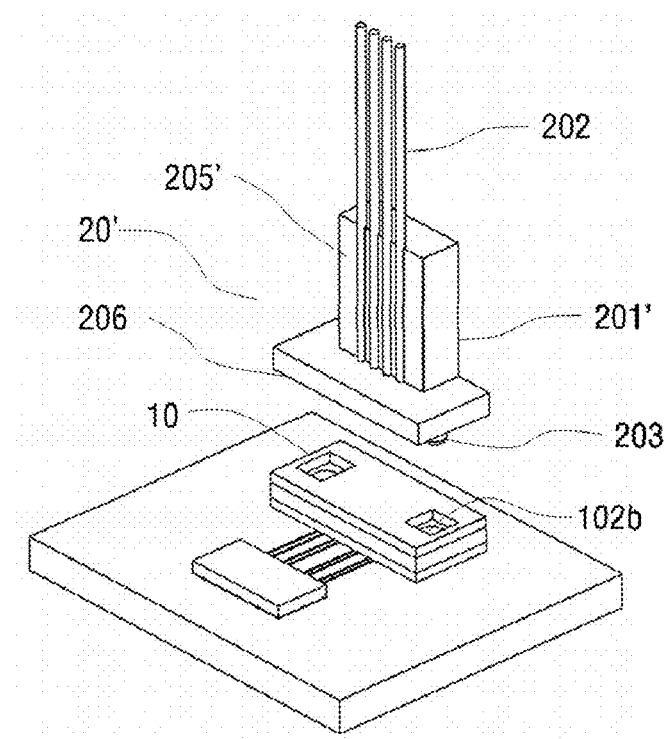
FIG. 14 is a perspective view of a transceiver module using an optical subassembly in accordance with still another embodiment of the present patent application.
Figure 15:
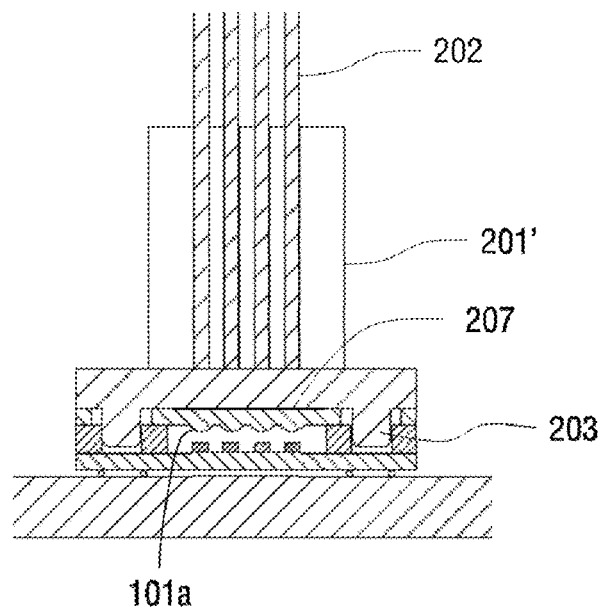
FIG. 15 is a cross-sectional view of the transceiver module depicted in FIG. 14.

FIG. 14 is a perspective view of a transceiver module using an optical subassembly in accordance with still another embodiment of the present patent application. FIG. 15 is a cross-sectional view of the transceiver module depicted in FIG. 14. In this embodiment, referring to FIG. 14 and FIG. 15, the fiber mounting portion 205' of the jumper plug 20' is in-line with the direction of light transmission as well as the engagement direction of the optical subassembly 10. The optical signal is transmitted between the optical subassembly 10 and fiber array 202 without going through any angled reflection surface.

Figure 16:
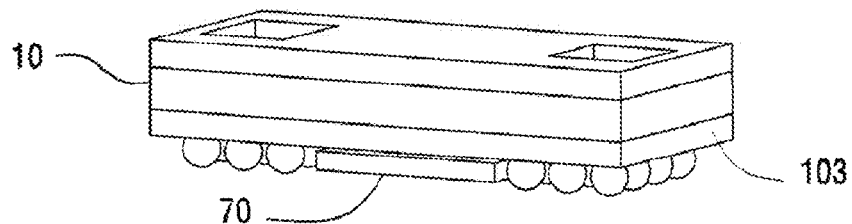
FIG. 16 is a perspective view of an optical subassembly in accordance with still another embodiment of the present patent application.
Figure 17:
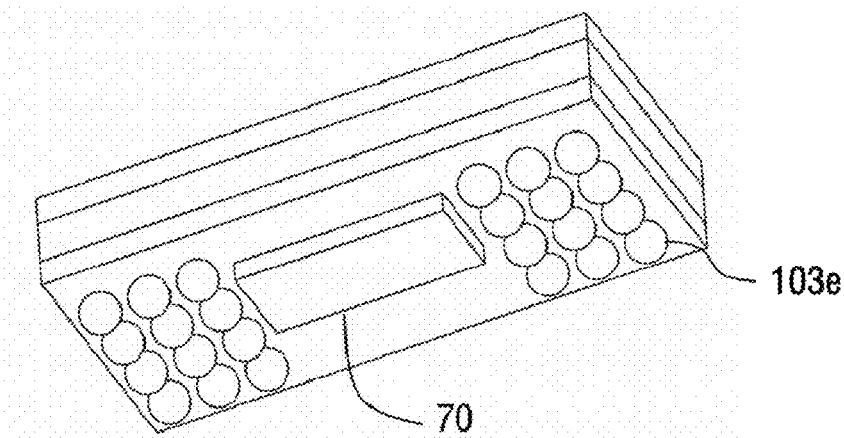
FIG. 17 is a bottom view of the optical subassembly depicted in FIG. 16.
Figure 18:
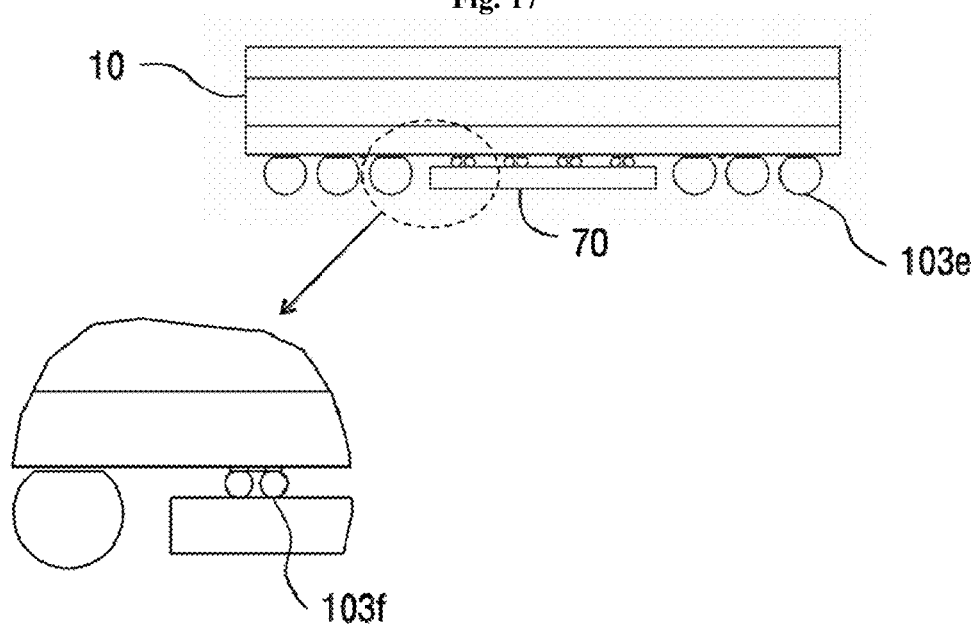
FIG. 18 shows side and partial magnified views of the optical subassembly depicted in FIG. 16.

FIG. 16 is a perspective view of an optical subassembly in accordance with still another embodiment of the present patent application. FIG. 17 is a bottom view of the optical subassembly depicted in FIG. 16. FIG. 18 shows side and partial magnified views of the optical subassembly depicted in FIG. 16. Referring to FIGS. 16-18, the optical subassembly 10 includes an integrated optical interface IC 70. The interface IC 70 is flip-chip bonded to the back side of the base layer 103. The I/O pads of the interface IC 70 are connected to the back-side metal contacts of the base layer 103 through micro solder bumps 103f. Conductive metal traces at the back side of the base layer 103 connect some contacts of the interface IC 70 with the active optoelectronic devices inside the optical subassembly 10 via a plurality of through silicon vias. Other contacts of the interface IC 70 are connected to additional solder bumps 103e deposited at the same side of the base layer 103. The solder bumps (or solder balls) 103e are configured to be connected to an external circuit system in a working communication system.

The above embodiments of the present patent application provides the following advantages: simplified optical subassembly packaging process compared with the conventional approach, cost-effective and high-throughput subassembly manufacturing process with little manual process, and efficient wafer-level testing and burn-in can be carried out, which eases the testing and burn-in requirement at the transceiver module production level.

In addition, the embodiments provide advantages such as wafer-scale packaging of optoelectronic components, simultaneous process of packaging multiple package units within the same wafer, low cost, high throughput, package material being based on established silicon wafer, low overall cost, fabrication precision being guaranteed by photolithography, possibility of providing hermetic sealing of components within the package, integrated optics and alignment features within the wafer-level package, improved module production yield, and final module assembly being compatible with the standard SMT component soldering process.

While the present patent application has been shown and described with particular references to a number of embodiments thereof, it should be noted that various other changes or modifications may be made without departing from the scope of the present invention.

What is claimed is:

1. A method for fabricating an optical subassembly comprising:
   fabricating a top layer silicon wafer, the top layer silicon wafer comprising a plurality of individual units of a top layer;
   fabricating a base layer silicon wafer, the base layer silicon wafer comprising a plurality of individual units of a base layer;
   aligning and bonding the top layer silicon wafer and the base layer silicon wafer thereby forming a first wafer assembly;
   assembling a plurality of active optoelectronic elements onto the first wafer assembly;
   fabricating a glass wafer;
   aligning and bonding the glass wafer to the first wafer assembly thereby forming a second wafer assembly; and
   dicing the second wafer assembly into individual optical subassemblies; wherein:
   the step of fabricating the top layer silicon wafer comprises etching a primary cavity and a plurality of peripheral cavities on each individual unit of the top layer; and
   the active optoelectronic elements are assembled within the primary cavities of the first wafer assembly.

2. The method of claim 1, wherein the step of fabricating the top layer silicon wafer further comprises wafer thinning, and deposition of an oxide layer for wafer bonding.

3. The method of claim 1, wherein the step of fabricating of the base layer silicon wafer comprises wafer thinning, etching of through via holes, deposition of an oxide layer for insulation, deposition of metal to fill the via holes, deposition of metal patterns on top and bottom surfaces of the base layer silicon wafer, and surface finishing to enable component bonding.

4. The method of claim 3, further comprising:
providing a plurality of upper conductive pads on a bottom surface of the primary cavity; and
bonding the plurality of upper conductive pads to the active optoelectronic elements.

5. The method of claim 4, further comprising:
providing a plurality of lower conductive pads at a lower peripheral surface of the optical subassembly.

6. The method of claim 5, further comprising:
connecting the via holes to the lower conductive pads respectively; wherein the lower conductive pads are attached with solder balls configured to allow the optical subassembly to be attached to a circuit board.

7. The method of claim 3, further comprising: attaching solder bumps to a back side of the second wafer assembly.

8. The method of claim 1, further comprising:
forming a first opening and second openings on the top layer; wherein:
the primary cavity is defined by the first opening of the top layer, a bottom surface plane of the glass wafer and a top surface plane of the base layer; and
the plurality of peripheral cavities are defined by the second openings of the top layer and the top surface plane of the base layer which are around the at least one primary cavity.

9. The method of claim 8, further comprising:
forming a plurality of third openings on the glass wafer; wherein each of the third openings is aligned with one of the peripheral cavities as alignment features for external opto-mechanical parts.

10. The method of claim 9, wherein the size of each third opening is larger than that of the peripheral cavity aligned with the third opening.

11. The method of claim 1, wherein the active optoelectronic elements comprise laser diodes or photo detectors, in either a singlet form or an array form.

12. The method of claim 1, further comprising:
providing a plurality of upper conductive pads on a bottom surface of the primary cavity; and
bonding the plurality of upper conductive pads to the active optoelectronic elements.

13. The method of claim 12, further comprising:
providing a plurality of lower conductive pads at a lower peripheral surface of the optical subassembly.

14. The method of claim 1, further comprising:
defining a plurality of optical elements on the glass wafer;
aligning the optical elements with the active optoelectronic elements; and
configuring the optical elements to facilitate coupling of optical signals between the active optoelectronic elements and external fibers.

15. The method of claim 1, wherein the projection of the primary cavity on the top layer has a squared shape, and the projections of the peripheral cavities on the top layer have a circular shape.

16. The method of claim 1, wherein side walls of the primary cavity and the peripheral cavities are not perpendicular to a surface plane of the glass wafer.

17. The method of claim 1, further comprising:
bonding a flip-chip to a back side of the base layer;
depositing a plurality of solder bumps at the back side of the base layer; and
electrically connecting the solder bumps to the flip-chip.

* * * * *